United States Patent
Hamade et al.

(10) Patent No.: US 9,029,074 B2
(45) Date of Patent: May 12, 2015

(54) METHOD OF WATER REPELLENT TREATMENT FOR PATTERN SURFACE

(71) Applicant: Canon Kabushiki Kaisha, Tokyo (JP)

(72) Inventors: Yohei Hamade, Tokyo (JP); Etsuko Sawada, Tokyo (JP); Ken Ikegame, Ebina (JP); Hiroaki Mihara, Machida (JP); Satoshi Tsutsui, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/189,018

(22) Filed: Feb. 25, 2014

(65) Prior Publication Data
US 2014/0272725 A1    Sep. 18, 2014

(30) Foreign Application Priority Data
Mar. 13, 2013 (JP) ................. 2013-049998

(51) Int. Cl.
*G03F 7/26*    (2006.01)
*G03F 7/16*    (2006.01)

(52) U.S. Cl.
CPC ................... *G03F 7/16* (2013.01)

(58) Field of Classification Search
CPC ....... C03C 17/34; C03C 17/3405; G03F 7/16; C08K 3/34
USPC .......................... 430/325, 322, 330
See application file for complete search history.

(56) References Cited

U.S. PATENT DOCUMENTS
2013/0216958 A1    8/2013    Tsutsui et al.

FOREIGN PATENT DOCUMENTS
JP    2007-196162 A    8/2007
WO    2013/157659 A1    10/2013

OTHER PUBLICATIONS
JP 2007-196162, Tomoya, English Machine Translation (Abstract, Claims) Aug. 9, 2007.*

* cited by examiner

*Primary Examiner* — Caleen Sullivan
(74) *Attorney, Agent, or Firm* — Fitzpatrick, Cella, Harper & Scinto (57) ABSTRACT

Provided is a method of water repellent treatment for a pattern surface, the method including the steps of agitatingly mixing a perfluoropolyether-group-containing silane water repellent, an organic acid, a fluorine-containing solvent capable of dissolving the perfluoropolyether-group-containing silane water repellent and the organic acid, and water to hydrolyze the perfluoropolyether-group-containing silane water repellent, thereby obtaining a partial hydrolysate solution; forming a photosensitive resin layer on a substrate; applying the partial hydrolysate solution onto the photosensitive resin layer to form a water-repellent film; performing patterning exposure to the photosensitive resin layer and the water-repellent film; performing heat treatment to collectively cure an exposed portion of the photosensitive resin layer and the water-repellent film; and removing a non-exposed portion of the photosensitive resin layer and the water-repellent film by development treatment to form a pattern.

11 Claims, 1 Drawing Sheet

METHOD OF WATER REPELLENT TREATMENT FOR PATTERN SURFACE

BACKGROUND OF THE INVENTION

1. Field of the Invention

The present invention relates to a method of water repellent treatment for a pattern surface.

2. Description of the Related Art

In the fields of advanced devices such as a semiconductor device and a display panel, there is a proposal of a method involving subjecting a photosensitive material film to pattern (fine pattern) processing by a photolithography technology, and coating the fine pattern with a functional film uniformly. In particular, from the viewpoint of controlling waterproofness and wettability, there is a demand for a method of imparting water repellency to part of a member, and there is a proposal of a method involving forming a fine pattern having water repellency by a photolithography technology.

In this context, a fluorine-containing water repellent, which is typified by a perfluoroalkyl-group-containing compound, is a widely used water repellent. However, a long-chain-perfluoroalkyl-group (having a carbon number of C8 or more)-containing compound is persistent. Accordingly, there is a fear in that the long-chain-perfluoroalkyl-group-containing compound, which is typified by perfluorooctanesulfonic acid (PFOS) or perfluorooctanoic acid (PFOA), may affect the environment and the human body. Therefore, development of an alternative thereto has been widely performed. As the alternative, a perfluoropolyether-group-containing compound has been attracting attention. This compound is not biopersistent or accumulative in the environment, and exhibits high water repellency. In addition, from the viewpoint of usability, a compound containing hydrolyzable silane as an end having a reactive group has been mainly used. However, a fluorine-containing silane water repellent does not sufficiently react with a substrate when merely applied onto the substrate and heated, and sufficient durability is not obtained. In view of this, Japanese Patent Application Laid-Open No. 2007-196162 proposes a method involving forming a fluoroalkyl-group-containing silane compound, which has been hydrolyzed in the presence of a catalyst and water, into a film, thereby enhancing reactivity between the substrate and the formed film.

SUMMARY OF THE INVENTION

According to an embodiment of the present invention, there is provided a method of water repellent treatment for a pattern surface, the method including the steps of:

a) agitatingly mixing a perfluoropolyether-group-containing silane water repellent, an organic acid, a fluorine-containing solvent capable of dissolving the perfluoropolyether-group-containing silane water repellent and the organic acid, and water to hydrolyze the perfluoropolyether-group-containing silane water repellent, thereby obtaining a partial hydrolysate solution;

b) forming a photosensitive resin layer on a substrate;

c) applying the partial hydrolysate solution onto the photosensitive resin layer to form a water-repellent film;

d) performing patterning exposure to the photosensitive resin layer and the water-repellent film;

e) performing heat treatment to collectively cure an exposed portion of the photosensitive resin layer and the water-repellent film; and f) removing a non-exposed portion of the photosensitive resin layer and the water-repellent film by development treatment to form a pattern.

Further features of the present invention will become apparent from the following description of exemplary embodiments with reference to the attached drawings.

DESCRIPTION OF THE EMBODIMENTS

Preferred embodiments of the present invention will now be described in detail in accordance with the accompanying drawings.

As a method of forming a fine pattern whose surface has water repellency by a photolithography technology, there is a method involving forming a thin film having water repellency on a substrate containing a photosensitive resin, performing pattern exposure and heat treatment, and then performing development treatment. In this case, when the water-repellent film is formed using the method described in Japanese Patent Application Laid-Open No. 2007-196162, a desired pattern may not be obtained. For example, in the case of using a non-volatile catalyst such as a titanium catalyst, even after water-repellent film formation, the catalyst that may act as an acid remains in the water-repellent film. Accordingly, a non-exposed portion may cure, leading to the generation of a residue at the time of development in some cases. In addition, also in the case of using a strongly acidic catalyst such as hydrochloric acid, the catalyst may similarly cause the curing of a non-exposed portion, leading to the generation of a residue at the time of development in some cases.

In view of the problem, an object of the present invention is to provide a method that enables the formation of a fine pattern having a desired pattern shape, and having a surface excellent in water repellency and durability.

According to an embodiment of the present invention, there is provided a method of water repellent treatment for a fine pattern surface, the method including the steps of:

a) agitatingly mixing a perfluoropolyether-group-containing silane water repellent, an organic acid, a fluorine-containing solvent capable of dissolving the perfluoropolyether-group-containing silane water repellent and the organic acid, and water to hydrolyze the perfluoropolyether-group-containing silane water repellent, thereby obtaining a partial hydrolysate solution by;

b) forming a photosensitive resin layer on a substrate;

c) applying the partial hydrolysate solution onto the photosensitive resin layer to form a water-repellent film;

d) performing patterning exposure to the photosensitive resin layer and the water-repellent film;

e) performing heat treatment to collectively cure an exposed portion of the photosensitive resin layer and the water-repellent film; and f) removing a non-exposed portion of the photosensitive resin layer and the water-repellent film by development treatment to form a fine pattern.

In the method according to the present invention, the partial hydrolysate solution, which is obtained by mixing the perfluoropolyether-group-containing silane water repellent, the organic acid, the fluorine-containing solvent, and water in advance to partially hydrolyze the perfluoropolyether-group-containing silane water repellent, is used as a raw material for the water-repellent film. Thus, the perfluoropolyether-group-containing silane water repellent has been partially hydrolyzed at the time of its application, and hence has high reactivity with the photosensitive resin layer, resulting in a water-repellent film that exhibits high durability. Further, the water-repellent film exhibits high water repellency. In addition, a titanium catalyst, hydrochloric acid, or the like is not used, and the organic acid that is a weak acid is used. Accordingly, no residue is generated after the patterning, and a desired pattern shape is obtained. Hereinafter, embodiments of the present invention are described with reference to the drawings.

Figure 1:
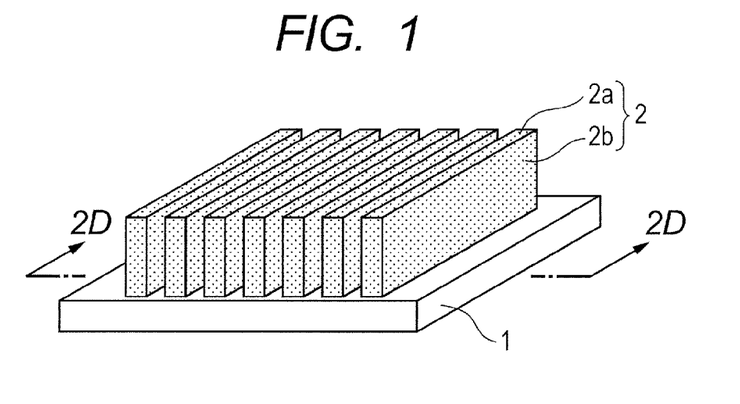
FIG. 1 is a perspective view of an example of a fine pattern subjected to water repellent treatment formed by a method according to the present invention.

FIG. 1 illustrates an example of a fine pattern subjected to water repellent treatment obtained by the method according to the present invention. The fine pattern illustrated in FIG. 1 includes, on a base plate 1, a photosensitive resin layer 2 forming a fine pattern. An upper surface 2a of the photosensitive resin layer 2 has formed thereon a water-repellent film (not shown).

Next, the method of water repellent treatment for a fine pattern surface according to the present invention is described with reference to FIGS. 2A to 2D. FIGS. 2A to 2D illustrate an example of a method of water repellent treatment for a fine pattern surface according an embodiment of the present invention. FIGS. 2A to 2D are process cross-sectional views corresponding to a cross-section taken along the line 2D-2D of FIG. 1. It should be noted that the present invention is not limited to this embodiment.

Step a)

In the step a), (A) a perfluoropolyether-group-containing silane water repellent, (B) an organic acid, (C) a fluorine-containing solvent, and (D) water are agitatingly mixed to hydrolyze the perfluoropolyether-group-containing silane water repellent. Thus, the partial hydrolysate solution is obtained. The components (A) to (D) are described in detail below.

(A) Perfluoropolyether-Group-Containing Silane Water Repellent

The perfluoropolyether-group-containing silane water repellent is not particularly limited, and is preferably at least one kind of compounds represented by the following formulae (1) to (4), from the viewpoints of general-purpose property and convenience.

(In the formula (1), Rp represents a perfluoropolyether group, A represents an organic group having from 1 to 12 carbon atoms, X represents a hydrolyzable group, Y represents a non-hydrolyzable group, and a represents an integer of from 1 to 3.)

(In the formula (2), Rp, A, X, Y, and a have the same meanings as in the formula (1).)

(In the formula (3), Z represents a hydrogen atom or an alkyl group, $Q^1$ represents a divalent linking group, m represents an integer of from 1 to 4, and Rp, A, X, Y, and a have the same meanings as in the formula (1).)

(In the formula (4), n represents 1 or 2, $Q^2$ represents a divalent linking group when n=1, and represents a trivalent linking group when n=2, and Rp, A, X, Y, and a have the same meanings as in the formula (1).)

In the formulae (1) to (4), an example of Rp is a group represented by the following formula (5).

(In the formula (5), q, r, s, and t represent 0 or an integer of 1 or more, provided that at least one of q, r, s, and t represents an integer of 1 or more.)

In the formula (5), it is preferred that q, r, s, and t represent an integer of 60 or less. In the formulae (1) to (4), A represents a group having 1 to 12 carbon atoms, preferably a group having 1 to 4 carbon atoms. When A represents a divalent group, examples thereof include: alkylene groups such as a methylene group, an ethylene group, and a propylene group; and alkyl ether groups such as a methyl ether group, a methyl ethyl ether group, and an ethyl ether group. When A represents a trivalent group, examples thereof include an alkylidyne group such as a methine group and a trivalent aryl group. A may have a substituent. Examples of the substituent represented by X in the formulae (1) to (4) include a halogen atom, alkoxy groups such as a methoxy group, an ethoxy group, and a propoxy group, an amino group, a hydrogen atom, an acyloxy group, a ketoxymate group, an aminooxy group, an amidooxy group, an amide group, and an acid amide group. Examples of the substituent represented by Y in the formulae (1) to (4) include: alkyl groups such as a methyl group, an ethyl group, and a propyl group; and an aryl group such as a phenyl group; and groups obtained by substituting part or all of hydrogen atoms bonded to carbon atoms thereof with, for example, a halogen atom such as a fluorine atom. In the formula (3), m represents an integer of from 1 to 4, preferably an integer of from 2 to 4.

The perfluoropolyether group moiety of the perfluoropolyether-group-containing silane water repellent has an average molecular weight of preferably 500 or more and 10,000 or less, more preferably 1,000 or more and 8,000 or less, still more preferably 2,000 or more and 6,000 or less. When the average molecular weight is 500 or more, sufficient water repellency is obtained. In addition, when the average molecular weight is 10,000 or less, sufficient solubility in the solvent is obtained. It should be noted that the perfluoropolyether group moiety of the perfluoropolyether-group-containing silane water repellent refers to a moiety constituting the perfluoropolyether group, and for example, in the formula (1), refers to the F-Rp- moiety. The average molecular weight is a value measured by gel permeation chromatography (GPC).

The average molecular weight of the perfluoropolyether-group-containing silane water repellent is not particularly limited, and may be set to 1,000 or more and 20,000 or less, preferably 2,000 or more and 10,000 or less. It should be noted that the average molecular weight is a value measured by gel permeation chromatography (GPC).

For example, compounds represented by the following formulae (6) to (9) are preferably used as the perfluoropolyether- group-containing silane water repellent, from the viewpoints of general-purpose property, adhesion to the substrate, and water repellency.

(In the formula (6), u represents an integer of from 3 to 60, and v represents an integer of from 1 to 3.)

(In the formula (7), w represents an integer of from 3 to 60.)

(In the formula (8), x represents an integer of 20 or less, and y represents an integer of 30 or less.)

(In the formula (9), z represents an integer of from 3 to 60.)

In the step a), when the perfluoropolyether-group-containing silane water repellent, the organic acid, the fluorine-containing solvent, and water are agitatingly mixed, the concentration of the perfluoropolyether-group-containing silane water repellent is preferably 0.1 mass % or more and 20 mass % or less. The concentration is more preferably 1 mass % or more and 15 mass % or less, still more preferably 3 mass % or more and 10 mass % or less. When the concentration is 0.1 mass % or more, the hydrolysis reaction proceeds smoothly. In addition, when the concentration is mass % or less, gelation and precipitation of a condensate due to the progress of dehydration condensation, and the like can be suppressed.

In addition, in the step a), when the perfluoropolyether-group-containing silane water repellent, the organic acid, the fluorine-containing solvent, and water are agitatingly mixed, it is preferred to perform heat treatment at 5° C. or more and 60° C. or less in order to promote the hydrolysis reaction. It is more preferred to perform heat treatment at 15° C. or more and 50° C. or less, and it is still more preferred to perform heat treatment at 25° C. or more and 45° C. or less. When the temperature of the heat treatment is 5° C. or more, the hydrolysis reaction proceeds sufficiently. In addition, when the temperature of the heat treatment is 60° C. or less, gelation and precipitation of a condensate due to the progress of dehydration condensation, and the like can be suppressed. It should be noted that, when the solution in the agitating mixing already has a temperature of 5° C. or more, the heat treatment may not be performed, but the solution is preferably heated to 25° C. or more.

(B) Organic Acid

In view of patterning property in photolithography, it is preferred to use, as the organic acid, a volatile organic acid that does not remain after the formation of the water-repellent film and is a weak acid. Specific examples thereof include carboxylic acids such as oxalic acid, acetic acid, formic acid, and propionic acid. One kind of those organic acids may be used, or two or more kinds thereof may be used in combination. In the step a), when the perfluoropolyether-group-containing silane water repellent, the organic acid, the fluorine-containing solvent, and water are agitatingly mixed, the mass of the organic acid is preferably 0.001 or more times and 1 or less times the mass of the perfluoropolyether-group-containing silane water repellent, from the viewpoints of catalysis and volatility. The mass of the organic acid is more preferably 0.003 or more times and 0.5 or less times, still more preferably 0.005 or more times and 0.3 or less times the mass of the perfluoropolyether-group-containing silane water repellent.

(C) Fluorine-Containing Solvent

As the fluorine-containing solvent, a fluorine-containing solvent capable of dissolving the perfluoropolyether group-containing silane water repellent and the organic acid is used. Specific examples thereof include a perfluorocarbon and a perfluoroether. An example of the perfluorocarbon is 1,1,1,2,2,3,3,4,4,5,5,6,6-tridecafluorooctane. An example of the perfluoroether is 1,1,1,2,2,3,4,5,5,5-decafluoro-3-methoxy-4-(trifluoromethyl)-pentane. Examples thereof include commercially available products such as Novec 7100, Novec 7200, Novec 7300 (trade names, manufactured by Sumitomo 3M Limited), and ASAHIKLIN AC-6000 (trade name, manufactured by ASAHI GLASS CO., LTD.). One kind of those fluorine-containing solvents may be used, or two or more kinds thereof may be used in combination. The solubility of water in the fluorine-containing solvent is preferably 100 ppm or less, more preferably 90 ppm or less, still more preferably 70 ppm or less. When the solubility of water in the fluorine-containing solvent is 100 ppm or less, the hydrolysis reaction of the perfluoropolyether-group-containing silane water repellent proceeds smoothly. It should be noted that the solubility of water in the fluorine-containing solvent may be set to 10 ppm or more.

(D) Water

The amount of water is, on a stoichiometric basis, preferably 0.1 equivalent or more and 5 equivalents or less, more preferably 0.2 equivalent or more and 3 equivalents or less, still more preferably 0.3 equivalent or more and 1 equivalent or less with respect to 1 equivalent of a hydrolyzable group of the perfluoropolyether-group-containing silane water repellent. It should be noted that equivalent in stoichiometry refers to an amount that allows a reaction to occur without any excess or deficiency of each constituent element when a substance having a certain chemical composition is produced. In the present invention, the amount of water of 1 equivalent with respect to 1 equivalent of the hydrolyzable group of the perfluoropolyether-group-containing silane water repellent corresponds to the amount of water that allows the hydrolyzable group of the perfluoropolyether-group-containing silane water repellent to undergo a hydrolysis reaction without any excess or deficiency. Specifically, in the case of the perfluoropolyether-group-containing silane water repellent represented by the formula (6) where v=3, the number of hydrolyzable groups per molecule is 9. Therefore, the amount of water in this case is preferably 0.9 mol or more and 45 mol or less with respect to 1 mol of the perfluoropolyether-group-containing silane water repellent. When the amount of water is 0.1 equivalent or more, the hydrolysis reaction proceeds sufficiently. In addition, when the amount of water is 5 equivalents or less, gelation and precipitation of a condensate due to the progress of dehydration condensation, and the like can be suppressed. It should be noted that the perfluoropolyether-group-containing silane water repellent does not need to be compatible with water.

Step b)

Figure 2A:
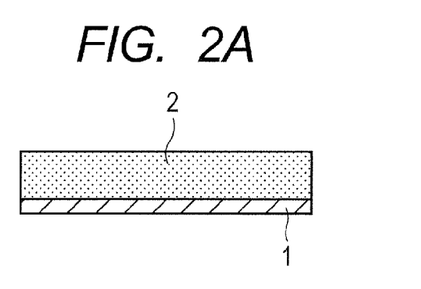
FIGS. 2A, 2B, 2C and 2D are cross-sectional views illustrating the method of water repellent treatment for a fine pattern surface according to the present invention.

In the step b), a photosensitive resin layer is formed on a substrate. A method of forming the photosensitive resin layer on the substrate is not particularly limited. For example, as illustrated in FIG. 2A, (E) a photosensitive resin is applied onto the base plate 1 to form the photosensitive resin layer 2. The material for the substrate is not particularly limited, and for example, glass, plastic, or metal such as Si may be used. (E) the photosensitive resin is described below.

(E) Photosensitive Resin

As the photosensitive resin, for example, there may be used photocationically polymerizable resins containing an epoxy compound, a vinyl ether compound, an oxetane compound, and the like. One kind of those photocationically polymerizable resins may be used, or two or more kinds thereof may be used in combination. In particular, a photocationically polymerizable resin containing an epoxy compound is preferred from the viewpoints of high mechanical strength and adhesion to a base.

Examples of the epoxy compound include a bisphenol A type epoxy resin and a novolac type epoxy resin. Examples thereof include commercially available products such as SU-8 (trade name, manufactured by Nippon Kayaku Co., Ltd.) and EHPE3150 (trade name, manufactured by DAICEL CORPORATION). One kind of those epoxy compounds may be used, or two or more kinds thereof may be used in combination. The epoxy equivalent of the epoxy compound is preferably 2,000 or less, more preferably 1,000 or less. When the epoxy equivalent is 2,000 or less, crosslinking density does not reduce during the curing reaction, and a reduction in the glass transition temperature of the cured product and a reduction in adhesion can be suppressed. As a photocationic polymerization initiator for curing the epoxy compound, for example, there may be mentioned an aromatic iodonium salt compound and an aromatic sulfonium salt compound. One kind of those photocationic polymerization initiators may be used, or two or more kinds thereof may be used in combination.

In addition, high fluidity of a coating film may reduce resolution in some cases, and hence the photosensitive resin is preferably a solid at ordinary temperature. The photosensitive resin layer 2 may be formed by a general-purpose method such as a spin coating method, a slit coating method, or a roll coating method.

Step c)

Figure 2B:
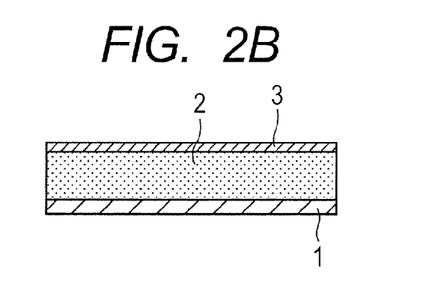

In the step c), the partial hydrolysate solution is applied onto the photosensitive resin layer 2 to form a water-repellent film 3 (FIG. 2B). The water-repellent film may be formed by a general-purpose method such as a spin coating method, a slit coating method, or a roll coating method. These methods allow the formation of a thin water-repellent film having a thickness of about several nm to several tens of nm. The thickness of the water-repellent film 3 is preferably 3 to 20 nm.

In the step c), the partial hydrolysate solution is applied onto the photosensitive resin layer preferably after the concentration of the partial hydrolysate in the partial hydrolysate solution is adjusted to 0.01 mass % or more and 1.0 mass % or less. The concentration is more preferably 0.03 mass % or more and 0.5 mass % or less, still more preferably 0.05 mass % or more and 0.3 mass % or less. When the concentration is adjusted within the range, concentration non-uniformity on the surface of the water-repellent film can be alleviated, resulting in uniform water repellency throughout the entire surface of the water-repellent film, and sufficient water repellency is obtained. A method of adjusting the concentration within the above-mentioned range is not particularly limited.

In the case of adjusting the concentration within the range by reducing the partial hydrolysate concentration, the concentration may be adjusted within the range by dilution with a fluorine-containing solvent capable of dissolving the partial hydrolysate. The fluorine-containing solvent is not particularly limited, and examples thereof include commercially available products such as Novec 7100, Novec 7200, Novec 7300, Novec 7600 (trade names, manufactured by Sumitomo 3M Limited), ASAHIKLIN AC-6000 (trade name, manufactured by ASAHI GLASS CO., LTD.), and m-xylene hexafluoride (manufactured by DAIKIN INDUSTRIES, LTD.). One kind of those fluorine-containing solvents may be used, or two or more kinds thereof may be used in combination.

In addition, after the step c) and before the step d) to be described later, heat treatment is preferably performed from the viewpoint of reactivity with the substrate. In the heat treatment, in order to prevent a non-exposed portion 6 to be described later from curing, the heat treatment temperature is preferably from 70 to 120° C. The heat treatment time is not particularly limited, and may be set to, for example, from 1 to 10 minutes.

Step d)

Figure 2C:
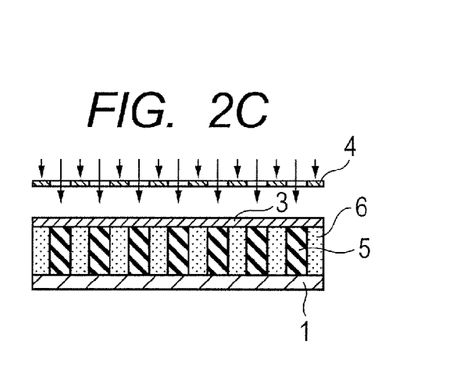

In the step d), patterning exposure to the photosensitive resin layer and the water-repellent film is performed. For example, as illustrated in FIG. 2C, exposure to the photosensitive resin layer 2 and the water-repellent film 3 is performed via a photomask 4 having formed thereon a pattern to form a latent image of a fine pattern. When the photosensitive resin is the photocationically polymerizable resin containing an epoxy compound, an acid generated during the exposure generates crosslinking in an exposed portion 5 in the step of subjecting the photosensitive resin layer 2 to heat treatment to be described later. In addition, the acid also promotes a reaction between an epoxy group in the photosensitive resin and a silanol group in the water-repellent film 3 at the exposed portion 5. In addition, in order to enhance reactivity between the photosensitive resin layer and the water-repellent film, a compound containing a hydroxy group or a compound capable of generating a hydroxy group may be added to the photosensitive resin layer. An example of the compound capable of generating a hydroxy group is a compound having a hydrolyzable silyl group.

Step e)

In the step e), heat treatment is performed to collectively cure an exposed portion of the photosensitive resin layer and the water-repellent film. The temperature of the heat treatment is not particularly limited, and may be set to, for example, from 70 to 120° C. The heat treatment time is not particularly limited, and may be set to, for example, from 1 to 10 minutes.

Step f)

Figure 2D:
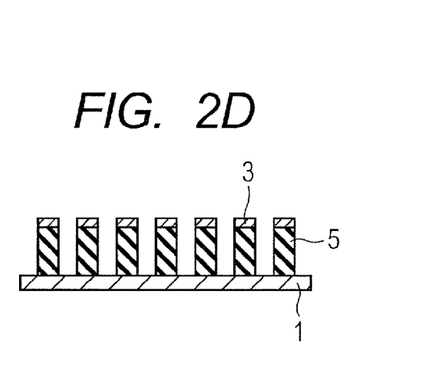

In the step f), a non-exposed portion of the photosensitive resin layer and the water-repellent film is removed by development treatment to form a fine pattern. For example, as illustrated in FIG. 2D, the non-exposed portion 6 of the photosensitive resin layer 2 is removed through the use of a solvent capable of dissolving the non-exposed portion 6. At this time, because the water-repellent film 3 is a thin film, the water-repellent film 3 present on the non-exposed portion 6 of the photosensitive resin layer 2 can also be removed together with the non-exposed portion 6 of the photosensitive resin layer 2 at the time of the development. The solvent is not particularly limited, and for example, a mixed solution of xylene/methyl isobutyl ketone (MIBK) may be used.

Finally, when the photosensitive resin is a photocationically polymerizable resin containing an epoxy compound, curing may be promoted with light, heat, or the like in order to completely crosslink an unreacted epoxy group in the photosensitive resin. This further promotes the reaction between the photosensitive resin and the perfluoropolyether-group-containing water repellent, and thus stronger binding between the photosensitive resin layer and the water-repellent film can be achieved.

The fine pattern having a surface subjected to water repellent treatment to be formed by the method according to the present invention has high liquid repellency with respect to liquid such as ink, and also has high abrasion resistance against rubbing and the like. Therefore, the method according to the present invention is suitably used particularly for the formation of a water-repellent film on the ejection orifice surface of an ink jet recording head.

EXAMPLES

Hereinafter, the present invention is described in detail by way of Examples, but the present invention is not limited to Examples to be described below.

Example 1

First, a perfluoropolyether-group-containing silane water repellent, an organic acid, a fluorine-containing solvent, and water were mixed according to the composition shown in Table 2, and were agitated at an agitating temperature shown in Table 2. Thus, the perfluoropolyether-group-containing silane water repellent was hydrolyzed to provide a partial hydrolysate solution. In this case, the compound represented by the formula (6) was used as the perfluoropolyether-group-containing silane water repellent, and acetic acid (manufactured by Wako Pure Chemical Industries, Ltd.) was used as the organic acid. In addition, ASAHIKLIN AC-6000 (trade name, manufactured by ASAHI GLASS CO., LTD.) was used as the fluorine-containing solvent, and ultrapure water (manufactured by Wako Pure Chemical Industries, Ltd.) was used as the water. It should be noted that the perfluoropolyether-group-containing silane water repellent had an average molecular weight of 4,000. In addition, the perfluoropolyether group moiety of the perfluoropolyether-group-containing silane water repellent has an average molecular weight of 3,500. In addition, the perfluoropolyether-group-containing silane water repellent was a mixture of compounds with different v values in the formula (6), and hence each composition was calculated on the assumption of v=3. In addition, the solubility of water in ASAHIKLIN AC-6000 was 50 ppm.

Next, one Si base plate for fine pattern shape confirmation and one Si base plate for contact angle measurement were prepared. Then, as illustrated in FIG. 2A, a photocationically polymerizable resin having the composition shown in Table 1 was applied onto the base plate 1 at a film thickness of 25 μm, followed by thermal treatment at 60° C. for 9 minutes, to thereby form the photosensitive resin layer 2.

TABLE 1

| Epoxy compound | EHPE3150 (trade name, manufactured by Daicel Corporation) | 100 parts by mass |
| Photocationic polymerization initiator | SP-172 (trade name, manufactured by ADEKA CORPORATION) | 6 parts by mass |
| Silane coupling agent | A-187 (trade name, manufactured by Momentive Performance Materials Japan LLC) | 5 parts by mass |

TABLE 1-continued

| Solvent | Xylene (manufactured by KISHIDA CHEMICAL Co., Ltd.) | 70 parts by mass |

Next, the partial hydrolysate solution was diluted with ASAHIKLIN AC-6000 so as to have a partial hydrolysate concentration of 0.1 mass %. The diluted solution was applied onto the photosensitive resin layer 2 by a spin coating method, followed by heat treatment at 70° C. for 3 minutes, to thereby form the water-repellent film 3 (FIG. 2B). Next, exposure to the photosensitive resin layer 2 and the water-repellent film 3 was performed using an i-line exposure stepper (manufactured by Canon Inc.) via the photomask 4 at a radiant energy (dose) of 350 mJ/cm$^2$ (FIG. 2C). In this case, the pattern shape for fine pattern shape confirmation was adjusted to line/space=10 μm/10 μm. In addition, the pattern shape for contact angle confirmation was adjusted to a square pattern shape measuring 5 mm on each side. After that, thermal treatment was performed at 90° C. for 4 minutes. Next, development was performed with a solution of xylene/MIBK=6/4 (mass ratio) to form a fine pattern (FIG. 2D). Finally, in order to completely cure the photosensitive resin layer 2 and the water-repellent film 3, thermal treatment was performed at 200° C. for 1 hour.

The water repellency and durability of the fine pattern film produced for use in contact angle measurement were evaluated by evaluating an initial dynamic contact angle θr with respect to pure water, a dynamic contact angle θr of the water-repellent film after a rubbing test with a wiper, and a dynamic contact angle θr of the water-repellent film after an alkali immersion test. The dynamic contact angle θr was measured using a fully automatic contact angle meter (product name: CA-W, manufactured by Kyowa Interface Science Co., Ltd.). In addition, in the rubbing test with a wiper, rubbing was performed to and from 2,000 times using a wiper (material: hydrogenated nitrile-butadiene rubber (HNBR), rubber hardness: JIS-A hardness of 75) at a pressing load between the wiper and the base plate of 0.098 N (10 gf). After that, the dynamic contact angle θr was measured. Further, in the alkali immersion test, the base plate was immersed in a 1 mol/L aqueous solution of NaOH at room temperature for 4 days. After that, the dynamic contact angle θr was measured. In addition, the shape of the fine pattern produced for use in fine pattern shape confirmation was confirmed with a scanning electron microscope (SEM) photograph. The SEM photograph was taken using a Hitachi field emission scanning electron microscope (product name: S-4300SE/N, manufactured by Hitachi High-Technologies Corporation). Table 6 shows respective evaluation results.

As shown in Table 6, the fine pattern film produced in Example 1 exhibited satisfactory water repellency in all the cases, i.e., at the initial stage, after the wiper test, and after the alkali immersion test. In addition, as for the shape of the fine pattern, the obtained pattern shape was confirmed to be a desired one.

Examples 2 to 17

Fine pattern films subjected to water repellent treatment were formed on base plates in the same manner as in Example 1 except that, in the preparation of the partial hydrolysate solution, conditions shown in Tables 2 to 4 were used. Table 6 shows respective evaluation results. It should be noted that, in Example 14, Novec 7300 (trade name, manufactured by Sumitomo 3M Limited) was used as the fluorine-containing solvent. The solubility of water in Novec 7300 was 67 ppm. In addition, in Example 15, ZEORORA-H (trade name, manufactured by ZEON CORPORATION) was used as the fluorine-containing solvent. The solubility of water in ZEORORA-H was 806 ppm. As shown in Table 6, the fine pattern films produced in Examples 2 to 17 exhibited satisfactory water repellency in all the cases, i.e., at the initial stage, after the wiper test, and after the alkali immersion test. In addition, as for the shape of the fine pattern, the obtained pattern shape was confirmed to be a desired one.

Example 18

A fine pattern film subjected to water repellent treatment was formed on a base plate in the same manner as in Example 1 except that, in the method of Example 1, the pattern exposure was performed without performing the heat treatment after the application of the diluted solution onto the photosensitive resin layer by the spin coating method. Table 6 shows evaluation results. As shown in Table 6, the fine pattern film produced in Example 18 exhibited satisfactory water repellency in all the cases, i.e., at the initial stage, after the wiper test, and after the alkali immersion test, but the water repellency was slightly inferior to that of Example 1. In addition, as for the shape of the fine pattern, the obtained pattern shape was confirmed to be a desired one.

Comparative Example 1

In the preparation of the partial hydrolysate solution, conditions shown in Table 5 were used. In other words, a liquid to be applied was prepared without adding the organic acid and water and without being heated and agitated. Thus, the perfluoropolyether-group-containing silane water repellent was not hydrolyzed. Except for the above, a fine pattern film subjected to water repellent treatment was formed on a base plate in the same manner as in Example 1. Table 6 shows evaluation results. In the fine pattern film produced in Comparative Example 1, a desired pattern shape was obtained, but as shown in Table 6, a low value of the initial water repellency was exhibited, and the water repellency markedly reduced by the wiper test and the alkali immersion test.

Comparative Examples 2 to 4

Fine pattern films subjected to water repellent treatment were formed on base plates in the same manner as in Example 1 except that, in the preparation of the partial hydrolysate solution, conditions shown in Table 5 were used. Table 6 shows respective evaluation results. It should be noted that, in Comparative Example 2, hydrochloric acid (manufactured by Wako Pure Chemical Industries, Ltd.) was used as the acid. In Comparative Example 2, as shown in Table 6, satisfactory water repellency was exhibited in all the cases, i.e., at the initial stage, after the wiper test, and after the alkali immersion test, but a residue was generated in the non-exposed portion, and a desired pattern shape was not obtained. In Comparative Examples 3 and 4, a desired pattern shape was obtained, but as shown in Table 6, a low value of the initial water repellency was exhibited, and the water repellency markedly reduced by the wiper test and the alkali immersion test.

TABLE 2

| | | | Example 1 | Example 2 | Example 3 | Example 4 | Example 5 | Example 6 |
|---|---|---|---|---|---|---|---|---|
| Composition | Perfluoropolyether-group-containing silane water repellent | Kind | Formula (6) | Formula (6) | Formula (6) | Formula (6) | Formula (8) | Formula (9) |
| | | Parts by mass | 5 | 5 | 5 | 5 | 5 | 5 |
| | Organic acid | Kind | Acetic acid | Formic acid | Acetic acid | Acetic acid | Acetic acid | Acetic acid |
| | | Parts by mass | 0.1 | 0.1 | 0.1 | 0.1 | 0.1 | 0.1 |
| | Fluorine-containing solvent | Kind | AC-6000 | AC-6000 | AC-6000 | AC-6000 | AC-6000 | AC-6000 |
| | | Parts by mass | 94.8 | 94.8 | 94.9 | 94.5 | 94.8 | 93.7 |
| | Water | Kind | Ultrapure water | Ultrapure water | Ultrapure water | Ultrapure water | Ultrapure water | Ultrapure water |
| | | Parts by mass | 0.10 | 0.10 | 0.02 | 0.40 | 0.14 | 0.20 |
| Average molecular weight of perfluoropolyether-group-containing silane water repellent | | | 4,000 | 4,000 | 8,500 | 1,000 | 2,000 | 1,300 |
| Average molecular weight of perfluoropolyether group moiety of perfluoropolyether-group-containing silane water repellent | | | 3,500 | 3,500 | 8,000 | 500 | 1,700 | 800 |
| Amount of water with respect to 1 equivalent of hydrolyzable group of perfluoropolyether-group-containing silane water repellent (equivalents) | | | 0.5 | 0.5 | 0.5 | 0.5 | 0.5 | 5.0 |
| Concentration of partial hydrolysate (mass %) | | | 0.1 | 0.1 | 0.1 | 0.1 | 0.1 | 0.1 |
| Agitating temperature (° C.) | | | 25 | 25 | 25 | 25 | 25 | 25 |

TABLE 3

| | | | Example 7 | Example 8 | Example 9 | Example 10 | Example 11 |
|---|---|---|---|---|---|---|---|
| Composition | Perfluoropolyether-group-containing silane water repellent | Kind | Formula (6) | Formula (6) | Formula (6) | Formula (6) | Formula (6) |
| | | Parts by mass | 0.1 | 20 | 5 | 5 | 5 |
| | Organic acid | Kind | Acetic acid | Acetic acid | Acetic acid | Acetic acid | Acetic acid |
| | | Parts by mass | 0.1 | 0.1 | 0.1 | 0.005 | 5 |
| | Fluorine-containing solvent | Kind | AC-6000 | AC-6000 | AC-6000 | AC-6000 | AC-6000 |
| | | Parts by mass | 99.8 | 79.5 | 94.8 | 94.9 | 89.9 |

TABLE 3-continued

|  |  | Example 7 | Example 8 | Example 9 | Example 10 | Example 11 |
|---|---|---|---|---|---|---|
| Water | Kind | Ultrapure water | Ultrapure water | Ultrapure water | Ultrapure water | Ultrapure water |
|  | Parts by mass | 0.002 | 0.40 | 0.10 | 0.10 | 0.10 |
| Average molecular weight of perfluoropolyether-group-containing silane water repellent |  | 4,000 | 4,000 | 4,000 | 4,000 | 4,000 |
| Average molecular weight of perfluoropolyether group moiety of perfluoropolyether-group-containing silane water repellent |  | 3,500 | 3,500 | 3,500 | 3,500 | 3,500 |
| Amount of water with respect to 1 equivalent of hydrolyzable group of perfluoropolyether-group-containing silane water repellent (equivalents) |  | 0.5 | 0.5 | 0.5 | 0.5 | 0.5 |
| Concentration of partial hydrolysate (mass %) |  | 0.1 | 0.1 | 0.1 | 0.1 | 0.1 |
| Agitating temperature (° C.) |  | 25 | 25 | 60 | 25 | 25 |

TABLE 4

|  |  |  | Example 12 | Example 13 | Example 14 | Example 15 | Example 16 | Example 17 |
|---|---|---|---|---|---|---|---|---|
| Composition | Perfluoropolyether-group-containing silane water repellent | Kind | Formula (6) | Formula (6) | Formula (6) | Formula (6) | Formula (6) | Formula (6) |
|  |  | Parts by mass | 5 | 5 | 5 | 5 | 5 | 5 |
|  | Organic acid | Kind | Acetic acid | Acetic acid | Acetic acid | Acetic acid | Acetic acid | Acetic acid |
|  |  | Parts by mass | 0.1 | 0.1 | 0.1 | 0.1 | 0.1 | 0.1 |
|  | Fluorine-containing solvent | Kind | AC-6000 | AC-6000 | Novec 7300 | ZEORORA-H | AC-6000 | AC-6000 |
|  |  | Parts by mass | 94.9 | 93.9 | 94.8 | 94.8 | 94.8 | 94.8 |
|  | Water | Kind | Ultrapure water | Ultrapure water | Ultrapure water | Ultrapure water | Ultrapure water | Ultrapure water |
|  |  | Parts by mass | 0.02 | 1.0 | 0.10 | 0.10 | 0.10 | 0.10 |
| Average molecular weight of perfluoropolyether-group-containing silane water repellent |  |  | 4,000 | 4,000 | 4,000 | 4,000 | 4,000 | 4,000 |
| Average molecular weight of perfluoropolyether group moiety of perfluoropolyether-group-containing silane water repellent |  |  | 3,500 | 3,500 | 3,500 | 3,500 | 3,500 | 3,500 |
| Amount of water with respect to 1 equivalent of hydrolyzable group of perfluoropolyether-group-containing silane water repellent (equivalents) |  |  | 0.1 | 5.0 | 0.5 | 0.5 | 0.5 | 0.5 |
| Concentration of partial hydrolysate (mass %) |  |  | 0.1 | 0.1 | 0.1 | 0.1 | 0.01 | 1.0 |
| Agitating temperature (° C.) |  |  | 25 | 25 | 25 | 25 | 25 | 25 |

TABLE 5

|  |  |  | Comparative Example 1 | Comparative Example 2 | Comparative Example 3 | Comparative Example 4 |
|---|---|---|---|---|---|---|
| Composition | Perfluoropolyether-group-containing silane water repellent | Kind | Formula (6) | Formula (6) | Formula (6) | Formula (6) |
|  |  | Parts by mass | 0.1 | 5 | 5 | 5 |
|  | Acid | Kind | — | Hydrochloric acid | Acetic acid | — |
|  |  | Parts by mass | — | 0.1 | 0.1 | — |
|  | Fluorine-containing solvent | Kind | AC-6000 | AC-6000 | AC-6000 | AC-6000 |
|  |  | Parts by mass | 99.9 | 94.8 | 94.9 | 94.9 |
|  | Water | Kind | — | Ultrapure water | — | Ultrapure water |
|  |  | Parts by mass | — | 0.10 | — | 0.10 |
| Average molecular weight of perfluoropolyether-group-containing silane water repellent |  |  | 4,000 | 4,000 | 4,000 | 4,000 |
| Average molecular weight of perfluoropolyether group moiety of perfluoropolyether-group-containing silane water repellent |  |  | 3,500 | 3,500 | 3,500 | 3,500 |
| Amount of water with respect to 1 equivalent of hydrolyzable group of perfluoropolyether-group-containing silane water repellent (equivalents) |  |  | — | 0.5 | — | 0.5 |
| Concentration of partial hydrolysate (mass %) |  |  | — | 0.1 | 0.1 | 0.1 |
| Agitating temperature (° C.) |  |  | — | 25 | 25 | 25 |

TABLE 6

| | Dynamic contact angle θr (°) | | |
|---|---|---|---|
| | Initial | After wiper test | After alkali immersion test |
| Example 1 | 98 | 86 | 85 |
| Example 2 | 99 | 87 | 85 |
| Example 3 | 99 | 87 | 84 |
| Example 4 | 94 | 81 | 80 |
| Example 5 | 97 | 85 | 84 |
| Example 6 | 99 | 87 | 85 |
| Example 7 | 93 | 80 | 80 |
| Example 8 | 99 | 87 | 85 |
| Example 9 | 99 | 87 | 86 |
| Example 10 | 98 | 85 | 84 |
| Example 11 | 99 | 87 | 85 |
| Example 12 | 97 | 86 | 83 |
| Example 13 | 95 | 82 | 82 |
| Example 14 | 98 | 85 | 84 |
| Example 15 | 93 | 80 | 80 |
| Example 16 | 95 | 82 | 81 |
| Example 17 | 99 | 87 | 85 |
| Example 18 | 94 | 81 | 80 |
| Comparative Example 1 | 90 | 76 | 65 |
| Comparative Example 2 | 97 | 82 | 81 |
| Comparative Example 3 | 92 | 77 | 67 |
| Comparative Example 4 | 91 | 76 | 65 |

According to the embodiments of the present invention, it is possible to provide a fine pattern having a desired pattern shape, and having a surface excellent in water repellency and durability.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-049998, filed Mar. 13, 2013, which is hereby incorporated by reference herein in its entirety.

What is claimed is:

1. A method of water repellent treatment for a surface, the method comprising the steps of:
   a) agitatingly mixing a perfluoropolyether-group-containing silane water repellent, an organic acid, a fluorine-containing solvent capable of dissolving the perfluoropolyether-group-containing silane water repellent and the organic acid, and water to hydrolyze the perfluoropolyether-group-containing silane water repellent, thereby obtaining a partial hydrolysate solution;
   b) forming a photosensitive resin layer on a substrate;
   c) applying the partial hydrolysate solution onto a surface of the photosensitive resin layer to form a water-repellent film;
   d) performing patterning exposure to the photosensitive resin layer and the water-repellent film;
   e) performing heat treatment to collectively cure an exposed portion of the photosensitive resin layer and the water-repellent film; and
   f) removing a non-exposed portion of the photosensitive resin layer and the water-repellent film by development treatment to form a pattern.

2. The method according to claim 1, wherein the perfluoropolyether-group-containing silane water repellent comprises at least one of compounds represented by formulae (1) to (4):

in the formula (1), Rp represents a perfluoropolyether group, A represents an organic group having 1 to 12 carbon atoms, X represents a hydrolyzable group, Y represents a non-hydrolyzable group, and a represents an integer of 1 to 3;

in the formula (2), Rp, A, X, Y, and a have the same meanings as in the formula (1);

in the formula (3), Z represents a hydrogen atom or an alkyl group, $Q^1$ represents a divalent linking group, m represents an integer of 1 to 4, and Rp, A, X, Y, and a have the same meanings as in the formula (1); and in the formula (4), n represents 1 or 2, $Q^2$ represents a divalent linking group when n=1 and represents a trivalent linking group when n=2, and Rp, A, X, Y, and a have the same meanings as in the formula (1).

3. The method according to claim 1, wherein a perfluoropolyether group moiety of the perfluoropolyether-group-containing silane water repellent has an average molecular weight of 500 or more and 10,000 or less.

4. The method according to claim 1, wherein, in the step a), when the perfluoropolyether-group-containing silane water repellent, the organic acid, the fluorine-containing solvent, and the water are agitatingly mixed, a concentration of the perfluoropolyether-group-containing silane water repellent is 0.1 mass % or more and 20 mass % or less.

5. The method according to claim 1, wherein, in the step a), when the perfluoropolyether-group-containing silane water repellent, the organic acid, the fluorine-containing solvent, and the water are agitatingly mixed, heat treatment is performed at 5° C. or more and 60° C. or less.

6. The method according to claim 1, wherein, in the step a), when the perfluoropolyether-group-containing silane water repellent, the organic acid, the fluorine-containing solvent, and the water are agitatingly mixed, a mass of the organic acid is 0.001 or more times and 1 or less times a mass of the perfluoropolyether-group-containing silane water repellent.

7. The method according to claim 1, wherein, in the step a), when the perfluoropolyether-group-containing silane water repellent, the organic acid, the fluorine-containing solvent, and the water are agitatingly mixed, an amount of the water is, on a stoichiometric basis, 0.1 equivalent or more and 5 equivalents or less with respect to 1 equivalent of a hydrolyzable group of the perfluoropolyether-group-containing silane water repellent.

8. The method according to claim 1, wherein a solubility of the water in the fluorine-containing solvent is 100 ppm or less.

9. The method according to claim 1, wherein, in the step c), the partial hydrolysate solution is applied onto the photosensitive resin layer after a concentration of the partial hydrolysate in the partial hydrolysate solution is adjusted to 0.01 mass % or more and 1.0 mass % or less.

10. The method according to claim 1, further comprising performing heat treatment after the step c) and before the step d).

11. The method according to claim 1, wherein the photosensitive resin layer includes a photocationically polymerizable resin containing an epoxy compound.

* * * * *